United States Patent
Swartzlander, Jr. et al.

(10) Patent No.: US 9,369,132 B2
(45) Date of Patent: Jun. 14, 2016

(54) DATA TAG CONTROL FOR QUANTUM-DOT CELLULAR AUTOMATA

(71) Applicant: THE BOARD OF REGENTS OF THE UNIVERSITY OF TEXAS SYSTEM, Austin, TX (US)

(72) Inventors: Earl E. Swartzlander, Jr., Austin, TX (US); Inwook Kong, Seoul (KR)

(73) Assignee: The Board of Regents of The University of Texas System, Austin, TX (US)

( * ) Notice: Subject to any disclaimer, the term of this patent is extended or adjusted under 35 U.S.C. 154(b) by 347 days.

(21) Appl. No.: 13/795,816

(22) Filed: Mar. 12, 2013

(65) Prior Publication Data

US 2013/0200921 A1   Aug. 8, 2013

Related U.S. Application Data

(63) Continuation of application No. 12/847,571, filed on Jul. 30, 2010, now Pat. No. 8,415,968.

(51) Int. Cl.
*H03K 19/195* (2006.01)
*B82Y 10/00* (2011.01)
*G06N 99/00* (2010.01)

(52) U.S. Cl.
CPC .............. *H03K 19/195* (2013.01); *B82Y 10/00* (2013.01); *G06N 99/002* (2013.01)

(58) Field of Classification Search
None
See application file for complete search history.

(56) References Cited

U.S. PATENT DOCUMENTS

| | | | | |
|---|---|---|---|---|
| 3,508,038 A | * | 4/1970 | Powers | G06F 7/5334 708/625 |
| 7,015,497 B1 | * | 3/2006 | Berger | B82Y 10/00 257/14 |

(Continued)

OTHER PUBLICATIONS

Earl E. Swartzlander, Jr., et al., Computer Arithmetic Implemented with QCA: A Progress Report; IEEE Asilomar 2010.*

(Continued)

*Primary Examiner* — Alexander H Taningco
*Assistant Examiner* — Nelson Correa
(74) *Attorney, Agent, or Firm* — Dorsey & Whitney LLP

(57) ABSTRACT

The present disclosure relates to methods and systems for data tag control for quantum dot cellular automata (QCA). An example method includes receiving data, associating a data tag with the data, communicating the data tag along a first wire-like element to a local tag decoder, reading instructions from the data tag using the local tag decoder, communicating the instructions to a processing element, communicating the data along a second wire-like element to the processing element, and processing the data with the processing element according to the instructions. A length of the first wire-like elements and a length of the second wire-like element are approximately the same such that communication of the instructions and the data to the processing element are synchronized.

29 Claims, 10 Drawing Sheets

(56) References Cited

U.S. PATENT DOCUMENTS

| | | | |
|---|---|---|---|
| 7,175,778 B1* | 2/2007 | Bhargava et al. | 252/62.51 R |
| 7,212,026 B2* | 5/2007 | Bourianoff | H03K 19/16 326/1 |
| 7,219,018 B2* | 5/2007 | Vitaliano | G06N 99/002 435/6.14 |
| 7,602,207 B2 | 10/2009 | Tougaw et al. | |
| 7,880,496 B1* | 2/2011 | Ranganathan | B82Y 10/00 326/37 |
| 7,959,081 B2 | 6/2011 | Lapstun | |
| 7,993,541 B1 | 8/2011 | Bhargava et al. | |
| 8,011,595 B2* | 9/2011 | Lapstun | G06F 3/0317 235/454 |
| 8,058,906 B2* | 11/2011 | Niemier | B82Y 10/00 326/104 |
| 8,415,968 B2* | 4/2013 | Swartzlander, Jr. | B82Y 10/00 326/6 |
| 8,510,618 B1* | 8/2013 | Pesetski | G06F 11/1048 257/34 |
| 8,610,111 B2* | 12/2013 | Cozzi | B82Y 10/00 257/40 |
| 9,001,574 B2* | 4/2015 | Fuhrer et al. | 365/171 |
| 2007/0145468 A1* | 6/2007 | Majumdar | B82Y 10/00 257/316 |
| 2009/0108873 A1 | 4/2009 | Tougaw et al. | |
| 2011/0155996 A1* | 6/2011 | Cozzi et al. | 257/9 |
| 2012/0030449 A1 | 2/2012 | Swartzlander, Jr. et al. | |

OTHER PUBLICATIONS

Cho, Heumpil et al., "Adder and Multiplier Design in Quantum-Dot Cellular Automata", IEEE Transactions on Computers, Jun. 2009, pp. 721-727, vol. 58, No. 6.

Goldschmidt, Robert E., "Applications of Division by Convergence", Submitted in partial fulfillment of the requirements for the Degree of Master of Science, Massachusetts Institute of Technology, Jun. 1964, 1-44.

Hänninen, Ismo et al., "Pipelined Array Multiplier Based on Quantum-Dot Cellular Automata", 18th European Conference on Circuit Theory and Design, 2007, pp. 938-941.

Huang, J. et al., "Design of Sequential Circuits by Quantum-Dot Cellular Automata", Microelectronics Journal, 2007, pp. 525-537, vol. 38.

Kim, Kyosun et al., "Towards Designing Robust QCA Architectures in the Presence of Sneak Noise Paths", Proceedings of the Design, Automation and Test in Europe Conference and Exhibition, 2005, pp. 1214-1219.

Kim, Seong-Wan et al., "Parallel Multipliers for Quantum-Dot Cellular Automata", IEEE Nanotechnology Materials and Devices Conference, Jun. 2-5, 2009, pp. 68-72.

Kong, I., "Design of a Goldschmidt Iterative Divider for Quantum-Dot Cellular Automata", 2009 IEEE/ACM International Symposium on Nanoscale Architectures, Jul. 30-31, 2009, 4 pages.

Lent, Craig S. et al., "A Device Architecture for Computing With Quantum Dots", Proceedings of the IEEE, Apr. 1997, vol. 85, No. 4.

Lent, Craig S. et al., "Quantum Cellular Automata: The Physics of Computing With Arrays of Quantum Dot Molecules", Proceedings of Workshop on Physics and Computation, 1994, pp. 5-13.

Oberman, Stuart F. et al., "Division Algorithms and Implementations", IEEE Transactions on Computers, Aug. 1997, pp. 833-854, vol. 46, No. 8.

Walus, K. et al., "Simple 4-Bit Processor Based on Quantum-Dot Cellular Automata (QCA)", Proceedings of the 16th International Conference on Application-Specific Systems, Architecture and Processors, 2005, pp. 288-293.

Walus, Konrad et al., "QCADesigner: A Rapid Design and Simulation Tool for Quantum-Dot Cellular Automata", IEEE Transactions on Nanotechnology, 2004, pp. 26-31, vol. 3.

Wang, Wei et al., "Quantum-Dot Cellular Automata Adders", Third IEEE Conference on Nanotechnology, 2003, pp. 461-464, vol. 1.

Zhang, Rumi et al., "A Method of Majority Logic Reduction for Quantum Cellular Automata", IEEE Transactions on Nanotechnology, Dec. 2004, pp. 443-450, vol. 3, No. 4.

* cited by examiner

P = + 1
BINARY 1

P = - 1
BINARY 0

DATA TAG CONTROL FOR QUANTUM-DOT CELLULAR AUTOMATA

CROSS REFERENCE TO RELATED APPLICATIONS

This application is a continuation under 35 U.S.C. §120 application Ser. No. 12/847,571, filed on Jul. 30, 2010, and issued as U.S. Pat. No. 8,415,968 on Apr. 9, 2013. This application and patent are incorporated herein by reference in their entirety and for any purpose.

BACKGROUND

A quantum-dot cellular automata (QCA) is a technology whose excitons are confined in all three spatial dimensions. QCA have properties that are between those of bulk semiconductors and those of discrete molecules. QCA may be used in many applications, for example, in transistors, solar cells, LEDs, diode layers, as agents for medical imaging. QCA may further be used as qubits and as memory. QCA may operate at very high densities and very low power and may be used in many applications.

BRIEF DESCRIPTION OF THE FIGURES

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

DETAILED DESCRIPTION

Figure 1:
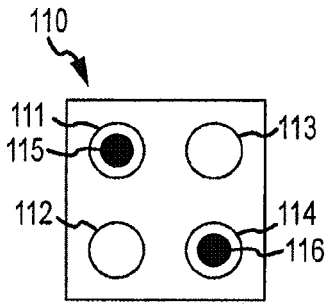
FIG. 1 illustrates an example QCA cell.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the drawings, may be arranged, substituted, combined, separated, and designed in a wide variety of different configurations, all of which are explicitly and implicitly contemplated herein.

This disclosure is drawn, inter alia, to methods, apparatus, computer programs and/or systems related to quantum-dot cellular automata. "QCA" is used herein to refer to Quantum-Dot Cellular Automata More specifically, various methods and systems for a data tagging QCA are provided. While the present disclosure may make specific reference to a Goldschmidt iterative divider for quantum-dot cellular automata, it is to be appreciated that the methods, apparatus, computer programs, and/or systems disclosed herein may be used in many other devices that provide logical and arithmetic computation for QCA systems.

Introduction to Quantum-Dot Cellular Automata

QCA is a type of quantum computational element that can be useful in building integrated circuits. QCA, more specifically, is a physical implementation of classical cellular automata by exploiting quantum mechanical phenomena.

In QCA, a very small box (the quantum dot cell) is built on an integrated circuit. That box has four wells that electrons can sit in. The electrons have the same polarity and thus repel one another forcing positions on the cell that can cause the cell to achieve differing polarity. An advantage of quantum dots over other circuit technologies is that they can be very small, for example on the order of 3 or 4 nanometers on a side, in contrast to standard integrated circuits having a width on the order of at least 22 nanometers. Generally, as many as a couple thousand. QCA cells could be put in the area of a minimum size gate in CMOS. This provides a density benefit.

In the context of models of computation or of physical systems, models of QCA may borrow elements of both the study of cellular automata in conventional computer science and the study of quantum information processing. Some common features of models of QCA may include:

The computation is considered to result from parallel operation of multiple computing devices, or cells. The cells are generally assumed to be identical, finite-dimensional quantum systems.

Each cell has a neighborhood of other cells. These form a network of cells. The network of cells is generally assumed to be regular, for example with the cells being arranged as a lattice with or without periodic boundary conditions.

Evolution of the cells tends to have physics-like symmetries. These symmetries may include locality and homogeneity. Locality refers to the next state of a cell depending only on its current state and that of its neighbors. Homogeneity refers to evolution generally acting the same everywhere. Evolution of the cells may be independent of time.

The state space of the cells, and the operations performed on them, are motivated by principles of quantum mechanics.

One feature that may be considered in a QCA model is that the model may be universal for quantum computation (i.e. it can efficiently simulate quantum Turing machines, some arbitrary quantum circuit, or simply all other quantum cellular automata).

QCA Cells

FIG. 1 illustrates an example QCA cell. QCA cells can be approximately square. As shown, the QCA cell comprises a box 110 having 4 quantum wells 111-114 provided therein. Two electrons 115 and 116 are provided inside the wells. Binary information is encoded by the positions of the electrons. Coulombic forces within the cell drive the electrons 115, 116 into opposing corners, either corners with wells 111 and 114 or corners with wells 112 and 113.

Figure 2:
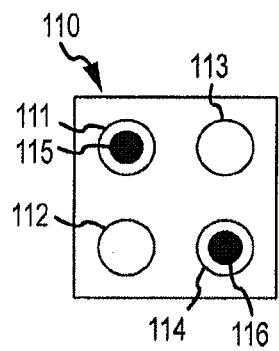
FIG. 2 illustrates a first possible polarization of a QCA cell.
Figure 3:
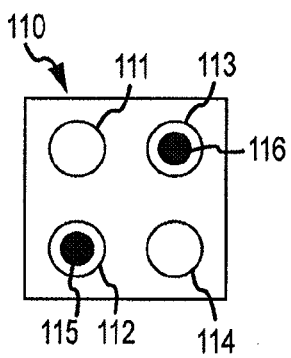
FIG. 3 illustrates a second possible polarization of a QCA cell.

FIG. 2 illustrates a first possible polarization of the QCA cell 110. FIG. 3 illustrates a second possible polarization of the QCA cell 110. Because the coulombic forces drive the electrons 115, 116 into opposing positions, there are two available polarizations, P=±1. As shown in FIG. 2, the cell 110 has electrons 115 and 116 in quantum wells 111 and 114, respectively. This cell 110 is arbitrarily assigned a polarization of +1 or a binary value of 1. In contrast, as shown in FIG. 3, cell 110 has electrons 115 and 116 in quantum wells 112 and 113, respectively. Accordingly, this cell 110 has a polarization of −1 or a binary value of 0.

For the purposes of illustration, a nominal cell size of 20 nm by 20 nm may be assumed. In FIGS. 2 and 3, for example, cell 110 may have a width and height of 18 nm and the quantum wells 111-114 may each be 5 nm in diameter. The cell 110 may be placed on a grid with a cell center-to-center distance of 20 nm.

Coulombic forces between neighboring QCA cells can be used to perform logical operations and computations. Since the basic principle of operation is very different from CMOS, QCA has many unique characteristics.

Figure 4:
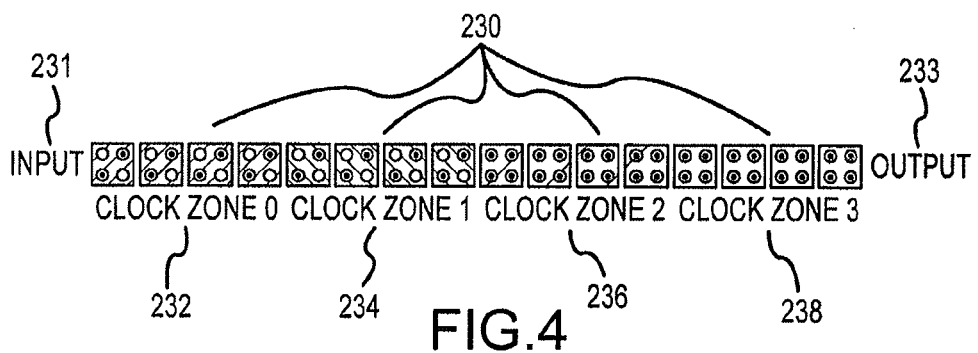
FIG. 4 illustrates a series of adjacent cells that are the QCA equivalent of a wire, in accordance with some examples of the present disclosure.

FIG. 4 illustrates a series of adjacent cells 230 that are the QCA equivalent of a wire, in accordance with some examples of the present disclosure. The circuit area may extend from an input 231 to an output 233 and is divided into four sections or zones 232, 234, 236, 238 and they are driven by four phase clock signals. In each zone, the clock signal has four states: low, low-to-high, high, high-to-low. The cell accepts its value during the high-to-low state and holds the value during the low state. The cell is released when the clock is in the low-to-high state and inactive during the high state. Thus signals propagate from one clock zone to the next.

Figure 6:
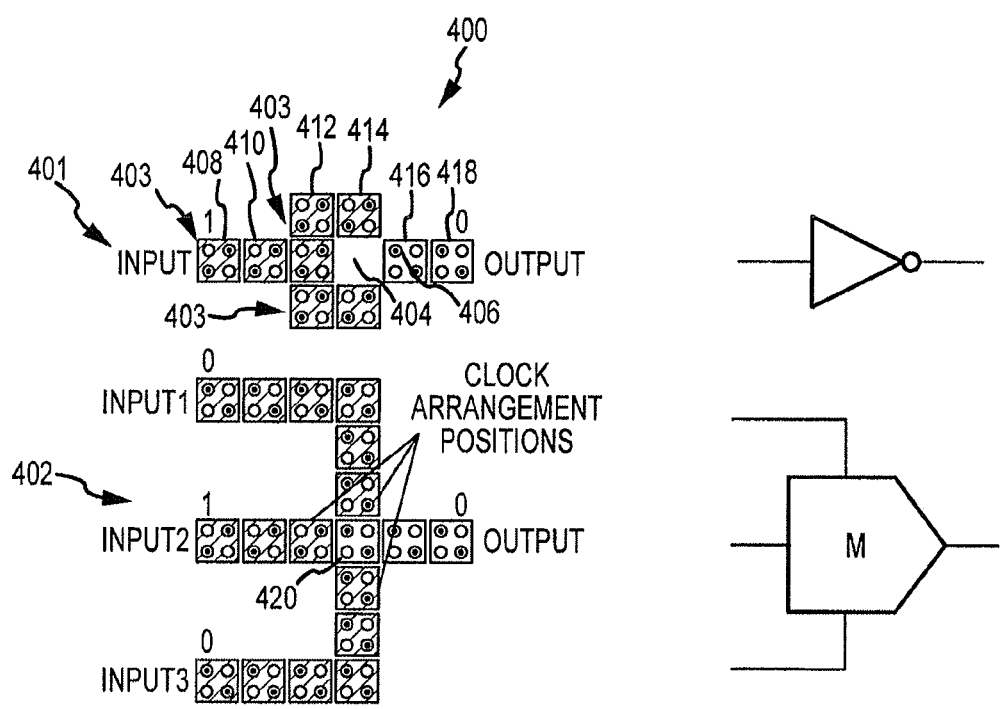
FIG. 6 illustrates an inverter structure and a majority gate structure, in accordance with some examples of the present disclosure.

In order to use a QCA cell to build a computer, three things can be used: a wire-type mechanism, as shown in FIG. 4, an AND gate and/or an OR gate, and an inverter, as shown in FIG. 6, below.

The wire-type mechanism facilitates communication of information from one place on a chip to another type of chip. In QCA, the cells are placed generally next to each other and a clocking mechanism is implemented. The general formation creates a configuration akin to that of a wire. In contrast to CMOS wires that have currents traveling over them, communication is done along the wire by polarity switching from one QCA cell to the neighboring QCA cell. More specifically, the polarity of a QCA cell may switch based on the previous cell. The electrons do not, however, travel from one QCA cell to another. Because no current flows along the wire-type mechanism, there is no outside indication of information flow along the wire-type mechanism.

A gate is used when information from two or more pathways needs to be combined to produce a result. Gates typically are OR gates or AND gates. Inputs and outputs from gates are 1s or 0s. With an OR gate, the output is a 1 if any of the inputs is a 1. With an AND gate, the output is a 1 if all of the inputs are 1. While a computer can be designed with OR gates and inverters or AND gates and inverters, a better system results with AND gates and OR gates and inverters.

QCA cells can be arranged to create three-input majority gates. With a QCA cell, there are inputs on 3 of the 4 sides. If two or three of the inputs are polarized in the 1 position, and one or none of the inputs is polarized in the 0 position, respectively, the inputs in the 1 position cause the center cell to take on a 1 position. The output taken from the fourth side is then a 1. Conversely, if two or three of the inputs are polarized in the 0 position, and one or none of the inputs is polarized in the 1 position, respectively, the inputs in the 0 position cause the center cell to take on a 0 position. The output taken from the fourth side is then a 0. This is described in more detail below with respect to FIG. 6.

OR gates and AND gates can be realized with majority gates. An input of a majority gate may be fixed to cause the majority gate to act as an AND gate or an OR gate. By fixing one of the three inputs to be a 0, both of the other inputs must be a 1 to get a 1 out of the output. Accordingly, the gate acts as an AND gate. By fixing one of the inputs to a 1, the gate acts as an OR gate, since a 1 on either of the remaining two inputs will yield a 1 on the output. Moreover, as those of skill in the art will appreciate, an inverter facilitates inversion of a signal. For example, an inverter can convert a signal from a 1 to a 0 and vice versa.

Generally speaking, in logic and binary systems, having an AND gate and an inverter enables any logic circuit/logic function to be built. Similarly, having an OR gate and an inverter enables any logic circuit/logic function to be built. In accordance with examples provided herein, a complete logic family is provided using QCA cells because there are AND gates, OR gates, inverters, and wire structures.

Contrast with Complementary Metal-Oxide Semiconductor Technology

Complementary metal-oxide semiconductor (CMOS) is a technology that is widely used for constructing integrated circuits. CMOS technology is used in microprocessors, microcontrollers, static RAM, and other digital logic circuits. CMOS technology may also be used for analog circuits such as image sensors, data converters, and highly integrated transceivers for many types of communication.

In CMOS, data is passed along a wire at a speed near the speed of light. A CMOS gate comprises at least two transistors and these transistors require power wires and control wires into and out of the transistors. The construction of a CMOS chip thus comprises multiple layers, commonly 30-50 mask layers, and wires associated with many of those layers. Signals penetrate the chip vertically and propagate horizontally. The use of CMOS technology has been increasingly challenging as semiconductor feature sizes are continually reduced because it is difficult to reduce the minimum size of the chip given the mask layers, wires, and other necessary structures. QCA is a nanotechnology that may mitigate the problems that arise with traditional CMOS integrated circuits. At least because QCAs operate according to different principles from CMOS technology, they avoid some of the problems associated with CMOS. More specifically, QCA chips generally comprise fewer than 10 mask layers, can be patterned very small, and are generally locked in alignment.

QCA System

Figure 5:
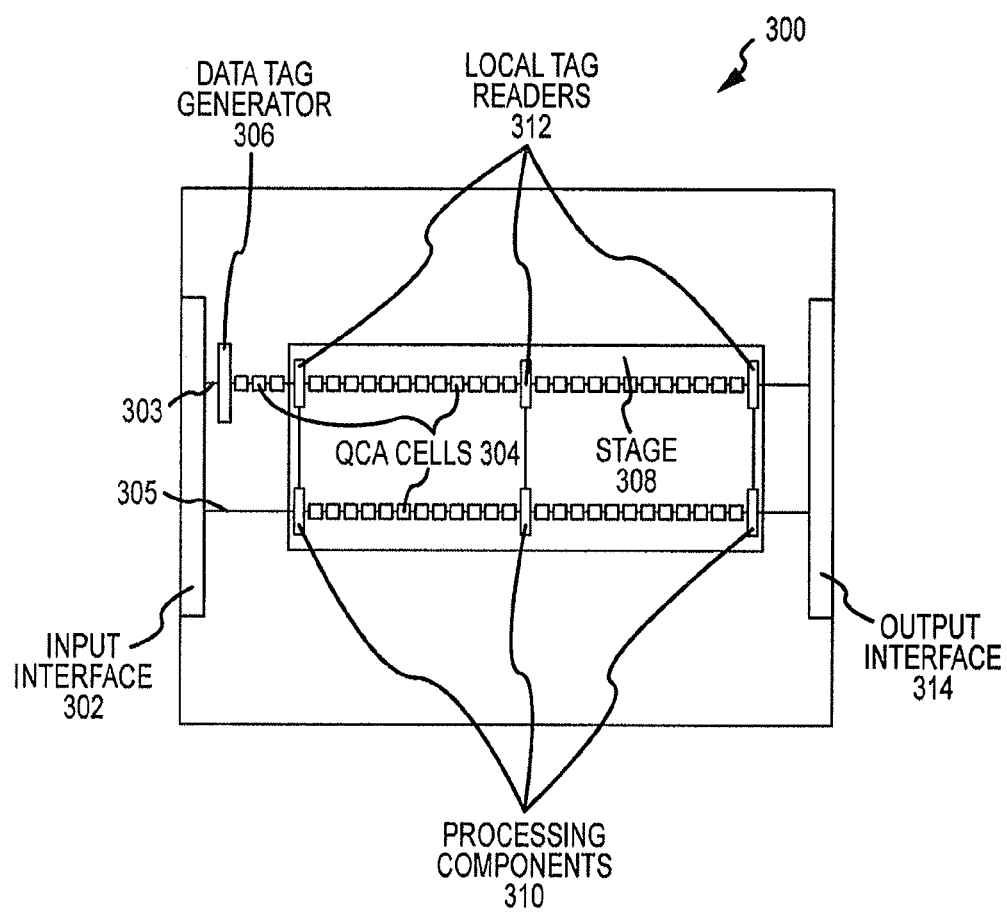
FIG. 5 illustrates a system for QCA, in accordance with some examples of the present disclosure.

FIG. 5 illustrates a system 300 for QCA, in accordance with some examples of the present disclosure. The system 300 includes an input interface 302, a plurality of QCA cells 304, a data tag generator (also referred to as a data tag encoder) 306, at least one stage 308 including processing components 310, local data tag readers (also referred to as data tag decoders) 312 associated with the processing elements 310, and an output interface 314. As shown, the QCA cells can follow two parallel routes 303, and 305. The data tag generator 306 and data tag readers 312 are provided along the first route 303 of QCA cells 304. The processing components 310 are provided along the second route 305 of QCA cells 304. Accordingly, the data tag travels along the first route 303 and the data travels along the second route 305. The local tag readers 312 communicate with the processing components 310 to instruct the processing components 310 regarding how to process the data.

In one aspect of the present disclosure, the data tag generator 306 in FIG. 6 can encode metadata in a 'tag' that is part of a 'word'. The word can contain data to be manipulated by the processing components 310, along with the encoded metadata to be read and decoded by the local tag readers 312. The size of each tag and data—and the word containing both—can depend on the computing context.

As is discussed more fully below in reference to Goldschmidt division, stages are formed when a complex function is decomposed into smaller, more primitive operations that can operate sequentially. For example, a Goldschmidt division stage typically comprises three iterations of a one subtraction followed by two multiplications. Depending on the required accuracy, a system may include two, three or more stages, each stage comprising a subtractor and two multipliers.

The data tag generator is placed proximate to the input interface, where data comes into the chip. Data enters the chip at the input interface along with a signal (e.g. metadata) indicating what to do with the data. The data tag generator places a tag with the data to give specific information to each processing element about what to do with the data. As the data travels across the QCA cells to various processing elements of stages, a local decoder reads the data tag to instruct the processing element regarding what action to take. At the end of the stages, and at the last QCA cell, the result travels to the output interface. At that point, the data tag indicates that this is a result and the data can be output for a further use or purpose.

Accordingly, in one example, a system for data tag control of QCA is provided comprising an input interface, a data tag generator, an output interface, a plurality of QCA cells extending between the input interface and the output interface, a first stage including a processing element, and a local tag decoder associated with the processing element. The input interface receives data. The data tag generator is provided proximate to the input interface and is configured to generate a data tag to associate with the data, the data tag comprising instructions for processing the data. The output interface outputs processed data. The plurality of QCA cells function as a wire for communicating the data along the system. At least some of the plurality of QCA cells extend through the first stage. The processing element of the first stage processes the data in accordance with the instructions of the data tag. The local tag decoder reads the instructions from the data tag.

Arithmetic Circuits in QCA

Arithmetic circuits in QCA use inverters, three-input majority gates, and processing elements. In QCA, inverters and three-input majority gates can serve as the fundamental gates.

Processing elements may be adders, subtracters, multipliers, or dividers. It is relatively easy to implement adders and subtracters using majority gates. Similarly, it is not excessively complex to implement a multiplier using majority gates. Implementing a divider using majority gates has been considered very complex.

While adders, subtractors, and multipliers each may comprise a single processing element (the adder, subtractor, or multiplier), a divider is a complicated structure itself comprising a plurality of processing elements. For example, a Goldschmidt divider comprises a stage formed of a subtractor and one or two multipliers. Data must be passed between each processing element of the stage and instructions must be given at each element of the stage to trigger the appropriate action of the element, all referred to herein as the control process.

In CMOS, the control process is relatively easy. A control unit is associated with the input interface and, as the data crosses the chip, the control unit sends information regarding what to do with the data. In CMOS, signals pass along the wires at roughly the speed of light. Delay along the wire is thus negligible and thus the data and the instructions arrive approximately simultaneously. In QCA, the wire like structure comprises a plurality of cells that pass polarization from one cell to the next. The delay along the wire like structure depends on the length of the wire like structure but generally is not negligible. This leads to coordination difficulties. More specifically, getting data and instructions from a control unit to a processing element at the same time can be difficult. The delay can complicate arithmetic in a QCA system and reduces the speed benefit of QCA relative CMOS provided due to the size of the cells.

The governing logic equation for a majority gate with inputs a, b, and c is:

$$M(a,b,c)=ab+bc+ca.$$

M(a,b,c) is the majority gate. Each of a, b, and c are the inputs. As shown in the equation, the majority gate is defined by the logical equation (a and b) or (b and c) or (c and a).

FIG. 6 illustrates an inverter structure 401 and a majority gate structure 402, in accordance with some examples of the present disclosure.

The inverter structure 401 comprises three rows 403 with an empty space 404 therebetween. The rows 403 each comprise a wire-like structure formed of QCA cells. A QCA cell 406 (referred to as an inverter QCA cell due to its placement relative to the lines) is provided at the ends of the two rows 403. The inverter QCA structure 401 may be used to invert the signal traveling the rows 403.

Six columns 408-418 are provided in the inverter structure 401 of FIG. 6. For an inverter, three cells can be used, those shown in columns 3, 4, and 5 (412, 414, and 416 respectively). By having two matching polarization gates separated by one position vertically, an inverter is formed by placing a QCA cell 406 in the open vertical position. In the specific embodiment shown, each QCA cell in columns 1, 2, 3, and 4 (408, 410, 412, 414) has the same polarization. The QCA cell in column 5 (416) takes the opposite polarization and acts as an inverter such that output in column 6 (418) is reversed.

In some examples, it may be possible to reduce the six columns to only columns 3, 4, and 5 (412, 414, and 416), to have additional columns, or to provide the input gates and/or the inverter at a different position so long as two matching polarization gates separated by one position are provided.

In other examples, it may be possible to configure the inverter 401 in still other ways. The general QCA inversion mechanism can be a function of coulombic forces and/or spatial orientation. Per FIG. 6, the QCA cells in column 4 414 have electrons in the 'northeast' and 'southwest' corners of the cells. This orientation of electrons, via Coulomb's Law, causes the QCA cell in column 5 416 to have its electrons in the 'northwest' and 'southeast' corners. Part of this causation mechanism can be a function the spatial orientation of the cells, since the cells in column 4 414 are arranged corner-to-corner with the cell in column 5 416—as opposed to being arranged side-to-side (although, this latter arrangement can also potentially be used in inversion in other aspects of this disclosure). Lastly, if the 'northeast'-'southwest' cells in column 4 414 are defined by convention as corresponding to a "0", then the 'northwest'-'southeast' cell in column 5 416 would be a "1"—or vice versa.

Next, the majority gate structure 402 in FIG. 6 illustrates three inputs, INPUT1, INPUT2, and INPUT3 leading to a majority cell 420. Thus, each of the QCA cells in structure 402 converge on the majority cell 420. As shown, inputs are from the top (towards INPUT1), from the left (INPUT2) and from the bottom (INPUT3). In this example shown, INPUT1 and INPUT3 have like polarizations while INPUT2 has an opposite polarization. The polarization of the majority gate 420 is influenced by each of the inputs INPUT1, INPUT2, and INPUT3. INPUT1 and INPUT3 are applying coulombic forces to the majority cell 420 in one direction, while INPUT2 is applying coulombic forces to the majority cell 420 in the other direction. In accordance with Coulomb's Law, INPUT1 and 3 have a combined force that is greater than the force of INPUT 2. Accordingly, if two inputs are pushing in the 0 state and one input is pushing in the 1 state (as shown in FIG. 6), the majority gate will be in the zero state. Conversely, if two inputs are pushing in the 1 state and one input is pushing in the 0 state, the majority gate will be in the one state.

Accordingly, as shown in FIG. 6, two input AND and OR gates may be implemented with 3 input majority gates by setting one input to a constant.

$$a \cdot b = M(a,b,0)$$

$$a+b = M(a,b,1).$$

With AND gates, OR gates, and inverters, any logic function may be realized.

Either multi-layer crossovers or coplanar crossings may be used for wire crossings. Multi-layer crossovers use more than one layer of cells like a bridge. The multi-layer crossover design is straightforward although there are questions about its realization, since it requires two overlapping active layers with vertical via connections. Alternatively, coplanar "crossovers" that may be easier to realize can be used.

Figure 7:
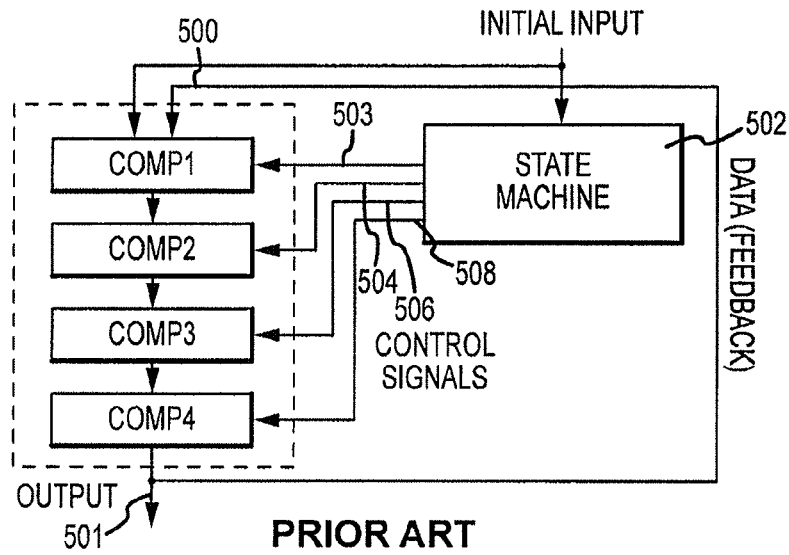
FIG. 7 illustrates a conventional iterative computation unit using a state machine, in accordance with prior art methods.

FIG. 7 illustrates conventional iterative computation units using state machines in accordance with prior art methods. As shown data 500 is input to COMP1 and flows through COMP2, COMP3, and COMP4 before being released as output 501. Concurrently, instructions are outputted from the state machine 502 to COMP1, COMP2, COMP3, and COMP4. Specifically, instructions for processing the data at COMP1 travel along route 503, instructions for processing the data at COMP2 travel along route 504, instructions for processing the data at COMP3 travel along route 506, and instructions for processing the data at COMP4 travel along route 508. As may be seen in FIG. 7, the route for the instructions travel increases in length as the data travels towards output. That is, route 508 is longer than route 503. Finite-state machines may be used to solve problems associated with electronic design automation, communication protocol design, parsing and other engineering applications. State machines for QCA often have synchronization problems due to the long delays between the state machines and the units (i.e., the computational circuits) to be controlled. Conventional iterative computation units using state machines such as shown in FIG. 7 are difficult to implement due to the long wire delays in QCA. Because wires are implemented by QCA cells like those used to construct gates, they have a delay. In addition, delays from a state machine to the units to be controlled vary according to the length of the wires. For example, the delay associated with route 508 is longer than the delay associated with route 503. Due to this irregular wire delay, it can be difficult to synchronize the inputs to units that are at a long distance from the state machine. Accordingly, iterative computational circuit designs for QCA are difficult to build with conventional sequential circuit design methods using state machines. Even a simple 4-bit microprocessor for implementation with QCA typically has been designed without using a state machine.

Figure 8:
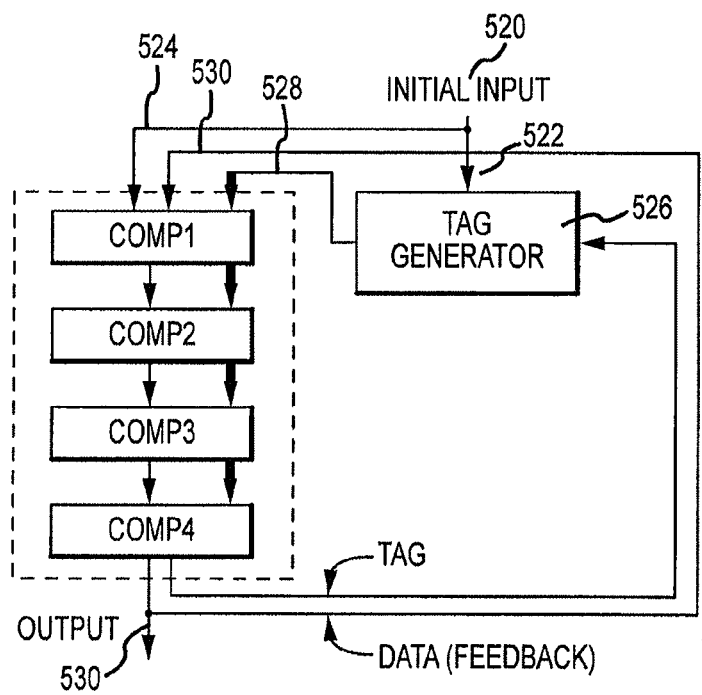
FIG. 8 illustrates a computation unit implementation using a data tag method, in accordance with some examples of the present disclosure.

The system shown in FIG. 8 substantially eliminates the delay associated with state machines and QCA. Specifically, the systems and methods provided herein implement a control process that does not require a control unit to send instructional information because the information for processing the data (the metadata) is carried through the system with the data itself.

Introduction to Data Tag Control Method for Quantum-Dot Cellular Automata

In accordance with examples provided herein, a data tag control method, system, and computer application for QCA are provided.

FIG. 8 illustrates a computation unit implementation using a data tagging, in accordance with some examples of the present disclosure. As shown, initial input 520 is divided into instructions (also referred to as metadata herein) 522 and data 524. The data 524 is fed to COMP1. The instructions 522 are fed to the tag generator 526. The tag generator 526 generates a tag 528 with instructions and feeds it to COMP1. The data and tag are then fed together through COMP2, COMP3, and COMP4 before being output at 530. In contrast to FIG. 7, the route for the instructions is the initial route from the tag generator 526 to COMP1, which is relatively short. Thereafter, the data and instructions travel together.

Accordingly, data tags are associated with the data at the input interface. As the data travels along the chip, local tag readers at each of COMP1, COMP2, COMP3, and COMP4 generate control signals for the units (i.e., the computational circuits) at each processing element of the chip. The tags are transferred with the data. The tags let the local tag readers generate control signals appropriate to each datum. Because the tags travel together with the data and local tag decoders output appropriate control signals for the units, the synchronization issues are substantially eliminated.

Another advantage of the architecture using the data tag method is that each datum on a data path can be processed differently according to the tag information. In typical Goldschmidt dividers for CMOS, a new division can not be started until the previous division is completed. In contrast, in QCA, there are many pipeline stages and most stages may be idle during iterations. With the data tag method, each datum on a path can be processed by the operation that is required for that stage. Since divisions at different stages are processed in a time skewed manner, a new division can be started while previous divisions are in progress if the initial pipeline stage of the data path is free. As a result, the throughput can be significantly increased.

Accordingly, in one example, a method for data tag control of QCA is provided. The method includes receiving data, associating a data tag with the data, and communicating the data tag along a first wire-like element to a local tag decoder, reading instructions from the data tag using the local tag decoder, communicating the instructions to a processing element, communicating the data along a second wire-like element to the processing element, and processing the data with the processing element according to the instructions. The data tag includes information for processing the data. The first wire-like element and the second wire-like element each comprise QCA cells. A length of the first wire-like elements and a length of the second wire-like element can be approximately the same such that communication of the instructions and the data to the processing element are synchronized.

Introduction to Goldschmidt Division

The data tag method for QCA systems may be used for any application with multiple computational elements. It is especially useful for processing units. Data tags effectively eliminate the delay between the travel of data and the travel of instructions for what to do to the data.

Goldschmidt division is a type of algorithm that may be used to perform division in digital designs. Several algorithms exist to perform division in digital designs. These algorithms fall into two main categories: slow division and fast division. Slow division algorithms produce one digit of the final quotient per iteration. Fast division methods start with an approximation to the final quotient and produce successively more accurate approximations (usually with about twice as many correct digits) to the final quotient on each iteration. Goldschmidt division falls into this category. Thus, to illustrate the system and method, Goldschmidt division is discussed. Alternatively, the data tag system and method may be used for any arithmetic computation in a QCA system.

Goldschmidt division as discussed herein is based on the form Q=N/D where:
Q=Quotient
N=Numerator (dividend)
D=Denominator (divisor).

More specifically, Goldschmidt division uses series expansion to converge to the quotient. The strategy of Goldschmidt division is to repeatedly multiply the dividend and divisor by a common factor $F_i$ to converge the divisor, D, to 1 as the dividend, N, converges to the quotient Q:

$$Q = \frac{N}{D} \frac{F_1}{F_1} \frac{F_2}{F_2} \frac{F \dots}{F \dots}.$$

Accordingly, the general steps for Goldschmidt division are:
(1) generate an estimate for the multiplication factor $F_i$,
(2) multiply the dividend and divisor by $F_i$, and
(3) loop to step (1).

Assuming N/D has been scaled so that ½<D<1, each $F_i$ is based on D:

$$F_{i+1} = 2 - D_i.$$

Multiplying the dividend and divisor by the factor $F_i$ yields:

$$\frac{N_{i+1}}{D_{i+1}} = \frac{N_i}{D_i} \frac{F_i}{F_i}.$$

After a sufficient number of iterations k: $Q=N_k$. In use with methods and systems disclosed herein, the number of iterations performed may correspond with those used until a threshold, for example, 10 decimal places is met.

The approximate quotient thus converges toward the true quotient by iteration. Before the iteration steps of the Goldschmidt division, both N and D are multiplied by $R_0$, an approximation of the reciprocal of D. Since $R_0$ is produced by a reciprocal table with limited precision, the denominator is not exactly 1, but has an error, $\epsilon$. Therefore, the first approximation of the quotient is:

$$Q_0 = \frac{N \times R_0}{D \times R_0} = \frac{N_0}{D_0} = \frac{N_0}{1 - \epsilon}.$$

At the i-th iteration, $R_i$ and $Q_i$ are as follows:

$$R_i = (2 - D_{i-1}) = 1 + \epsilon^{2^{i-1}} \text{ for } i > 0$$

$$Q_i = \frac{N_i}{D_i} = \frac{N_{i-1} R_i}{D_{i-1} R_i} = \frac{N_{i-1}(1 + \epsilon^{2^{i-1}})}{(1 - \epsilon^{2^i})}.$$

As the iteration continues, $N_i$ will converge toward Q with ever greater precision.

Goldschmidt division thus comprises a series of stages with each stage comprising a subtraction and two multiplications. Often the stage may be performed two or three times (two or three iterations). Each stage may be referred to as a pipeline stage comprised of three processing elements—a subtracter and two multipliers. In some examples, a chip may be organized with a plurality of identical stages each comprising identical processing elements. As the data exits one stage, it enters the next. The stages may be referred to as pipeline stages.

Figure 9:
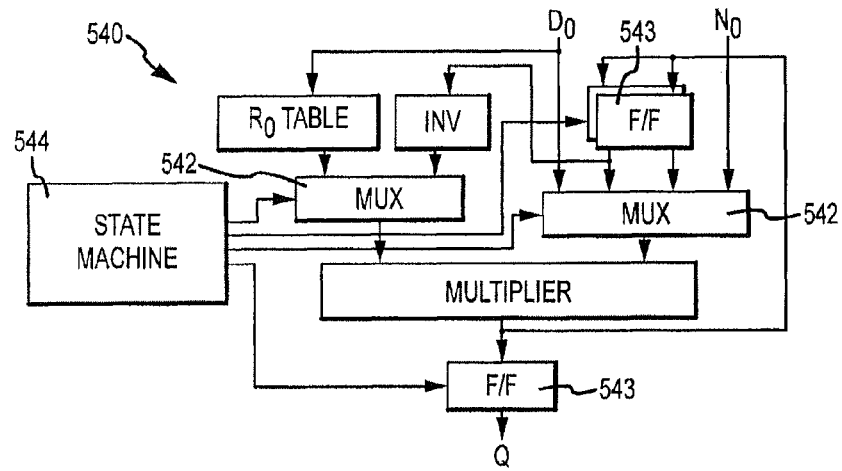
FIG. 9 illustrates a block diagram of a Goldschmidt divider for realization with CMOS technology, in accordance with prior art methods.

FIG. 9 illustrates a block diagram of a Goldschmidt divider 540 for realization with CMOS technology in accordance with prior art methods. The divider 540 uses multiplexers 542 and flip-flops 543 that are controlled by a state machine 544 during iterations. This architecture poses a problem for QCA in synchronization, due to the long delays between the state machine and the multiplexers. It further does not take advantage of the inherent deep pipeline stages that are available in QCA.

Goldschmidt Divider with the Data Tag Method

As an example to illustrate a data tag control method, an architecture using fixed-point Goldschmidt divider is provided. In one implementation using this architecture, a fixed-point Goldschmidt divider is implemented using a look-up table, an inverter, and a multiplier.

Figure 10:
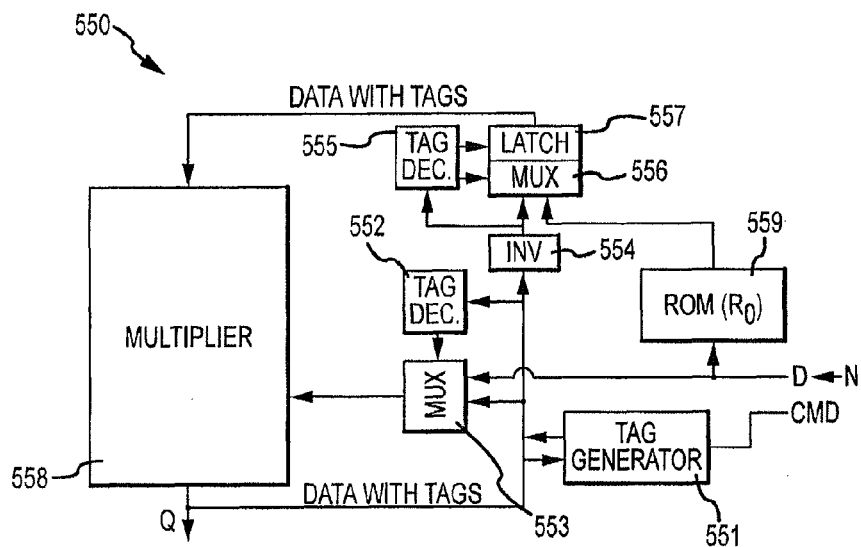
FIG. 10 illustrates a Goldschmidt divider using a data tag method, in accordance with some examples of the present disclosure.

FIG. 10 illustrates a Goldschmidt divider 550 using a data tag method, in accordance with some examples of the present disclosure. FIG. 10 illustrates a specific implementation using the QCA majority gates and dividers of FIG. 5. A tag generator 551, a first tag decoder 552 and associated multiplexer 553, an inverter 554, a second tag decoder 555 and associated multiplexer 556 and latch 557, and a multiplier 558 are shown. FIG. 10 further illustrates a read only memory (ROM) 559 storing an approximate reciprocal $R_0$.

N represents the numerator and D represents the denominator in Goldschmidt division.

To start a new division, the tag generator issues a new tag for the data. The local tag decoders control the processing elements of each stage according to the tags associated with the data. Each division may be processed in its own iteration stage while other divisions are being performed. As a result, the throughput of the Goldschmidt divider is maximized. Convergence is quadratic such that the number of digits that is correct doubles each iteration. As a consequence, three iterations are generally sufficient to achieve a suitable level of precision. Alternatively, additional iterations may be used.

A Goldschmidt iterative divider is provided using an architecture that addresses problems arising in implementing conventional state machines in QCA and including those that result from delays in QCA wires. The design improves the performance of QCA implementations of large systems. In particular, a data tag method is used to resolve synchronization problems of state machines for QCA.

In order to design a robust circuit, the Goldschmidt divider is designed using coplanar wire crossovers. In some examples, coplanar wire crossovers are used. Alternatively, multi-layer crossovers may be used. Robust operation of majority gates is attained by limiting the maximum number of cells that are driven by the output, which may be verified using the coherence vector method. The maximum cell number for each circuit component in a clock zone may be determined by simulations with sneak noise source. For example, the maximum cell number for a simple wire is 14, and the minimum is 1

In accordance with one example, the Goldschmidt iterative divider with the data tag method may be implemented using a 12-bit array multiplier and an 8-word by 3-bit read only memory (ROM). D and N are input sequentially into the divider. The CMD signal is asserted together with D, and a new data tag is generated from the tag generator. The tag decoders control the multiplexers and the latches using this data tag. During the first iteration, the multiplexers are controlled such that D and N are multiplied sequentially by $R_0$ from the reciprocal ROM. After the first iteration is completed, the data tag is changed for the next iteration through the tag generator. During the other iterations, the multiplexers select $\{D_i, N_i\}$ from the outputs of the multiplier and the $R_i$ that is computed using one's complement. The one's complement operation which approximates subtraction of the input from the number 2 is implemented efficiently with inverters. After three iterations (for example), the final quotient is computed and the data tag is eliminated by the tag generator.

Figures 11, 12:
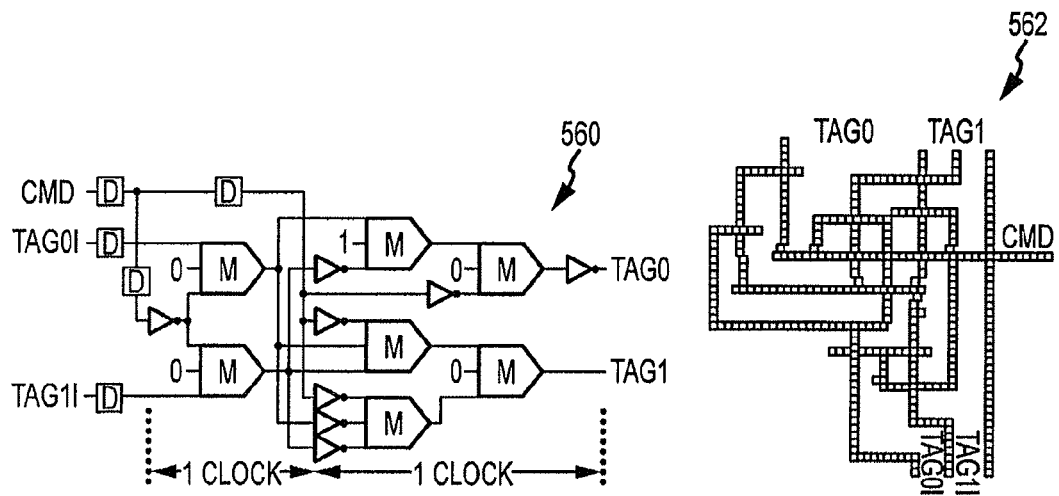
FIG. 11 illustrates a QCA tag generator implemented using majority logic reduction, in accordance with some examples of the present disclosure.
FIG. 12 illustrates the ROM implementation of the QCA tag generator of FIG. 11, in accordance with some examples of the present disclosure.

FIG. 11 illustrates a QCA tag generator 560 implemented using majority logic reduction, in accordance with some examples of the present disclosure. FIG. 12 illustrates the QCA implementation 562 of the tag generator circuit of FIG. 11, in accordance with some examples of the present disclosure. The tag generator 560 creates a new tag and/or changes the tag. A new tag (TAG[1:0]=01) is generated when the CMD signal is asserted.

Figures 13, 14:
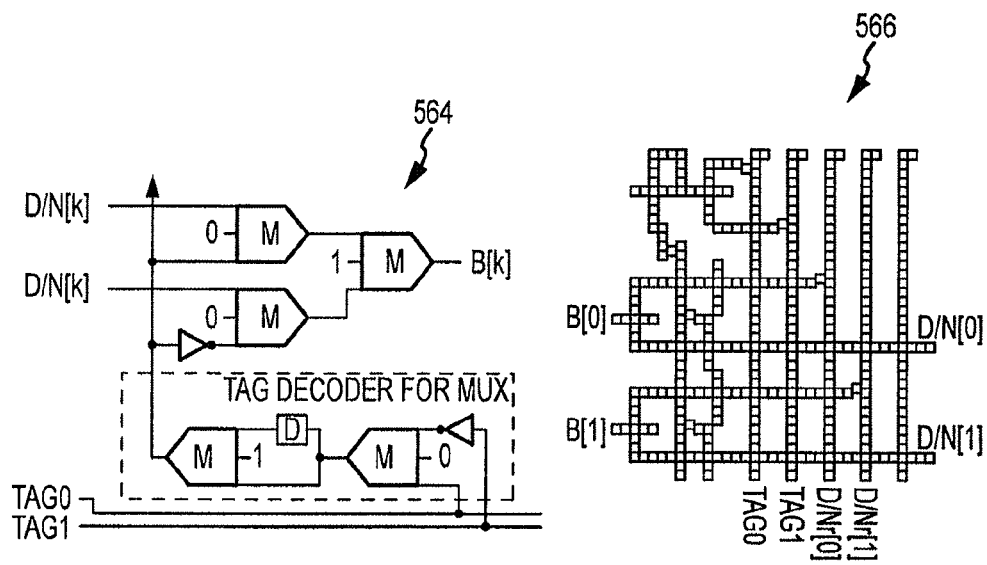
FIG. 13 illustrates a QCA elimination of dummy tag data by two AND gates, in accordance with some example of the present disclosure.
FIG. 14 illustrates the ROM implementation of the QCA elimination of FIG. 13, in accordance with some examples of the present disclosure.

FIG. 13 illustrates QCA elimination 564 of dummy tag data by two AND gates, in accordance with some examples of the present disclosure. FIG. 14 illustrates the QCA implementation 566 of the data tag elimination circuit of FIG. 13, in accordance with some examples of the present disclosure. In order to differentiate between $D_i$ and $N_i$, the data tag is associated with only $D_i$, the first datum of a $\{D_i, N_i\}$ data set. $N_i$ may be associated with a dummy data tag at least because QCA wires for the data tags cannot be reset during start-up. If a tag arrives at the tag generator after an iteration, the tag number is increased for the next iteration. After a division is completed, the data tag is eliminated (TAG[1:0]=00).

The tag decoder and the multiplexers for $\{D_i, N_i\}$ may be implemented as shown in FIG. 13. When TAG[1:0] is 01, the multiplexers M select $\{D, N\}$ from the input data port. Since the multiplexers M have to pass N one clock after D, the multiplexer selection signal in the tag decoder is held for two clocks as shown in FIG. 11.

Figure 15:
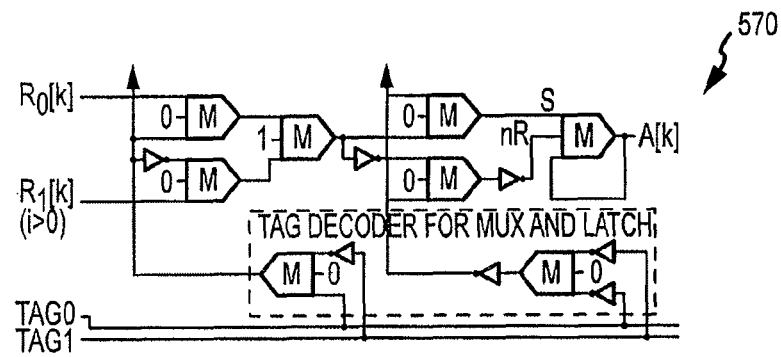
FIG. 15 illustrates a QCA latch implemented by a SR latch using a majority gate, in accordance with some examples of the present disclosure.

FIG. 15 illustrates a QCA latch 570 implemented by a SR latch using a majority gate, in accordance with some examples of the present disclosure. The multiplexers M for $R_i$ use latches to hold. $R_i$ for two clocks. During the two clocks, $D_i$ and $N_i$ are multiplied respectively by the value of $R_i$ that was held by the latches. They are triggered when TAG[1:0] is not 00.

Figure 16:
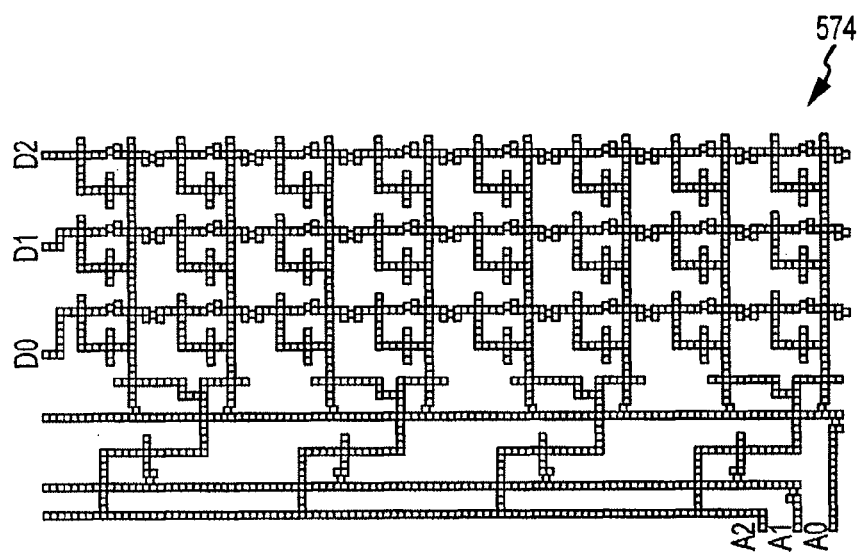
FIG. 16 illustrates the $2^3 \times 3$-bit reciprocal ROM implementation of the QCA latch of FIG. 15, in accordance with some examples of the present disclosure.

FIG. 16 illustrates the $2^3 \times 3$-bit reciprocal ROM implementation 574, in accordance with some examples of the present invention. As shown, the ROM may comprise a 3-bit decoder and an 8×3 ROM array, in accordance with some examples of the present disclosure. All the ROM cells have the same access time, 7 clocks. Since the range of $D_i[0:11]$ is $0.5 \leq D \leq 1.0$ for the Goldschmidt division, $D_i[0:1]$ is always 01, the input of the 3-bit ROM is $D_i[2:4]$. In contrast, the output is $R_0[1:3]$ since $R_0[0]$ is always 1.

The Goldschmidt divider has been implemented and stimulated using QCADesigner v2.0.3. Most default parameters for bistable approximation in QCADesigner v2.0.3 are used except two parameters: the number of samples and the clock amplitude factor. Since the recommended number of samples is 1000 times the number of clocks in a test vector, the number of samples is determined to be 226000. Since adiabatic switching is effective to prevent a QCA system from relaxing to a wrong ground state, the clock amplitude factor is adjusted to 1.0 for more adiabatic switching. Other major parameters may be as follows: size of QCA cell=18 nm×18 nm, center-to-center distance=20 nm, radius of effect=65 nm, and relative permittivity=12.9.

Figure 17:
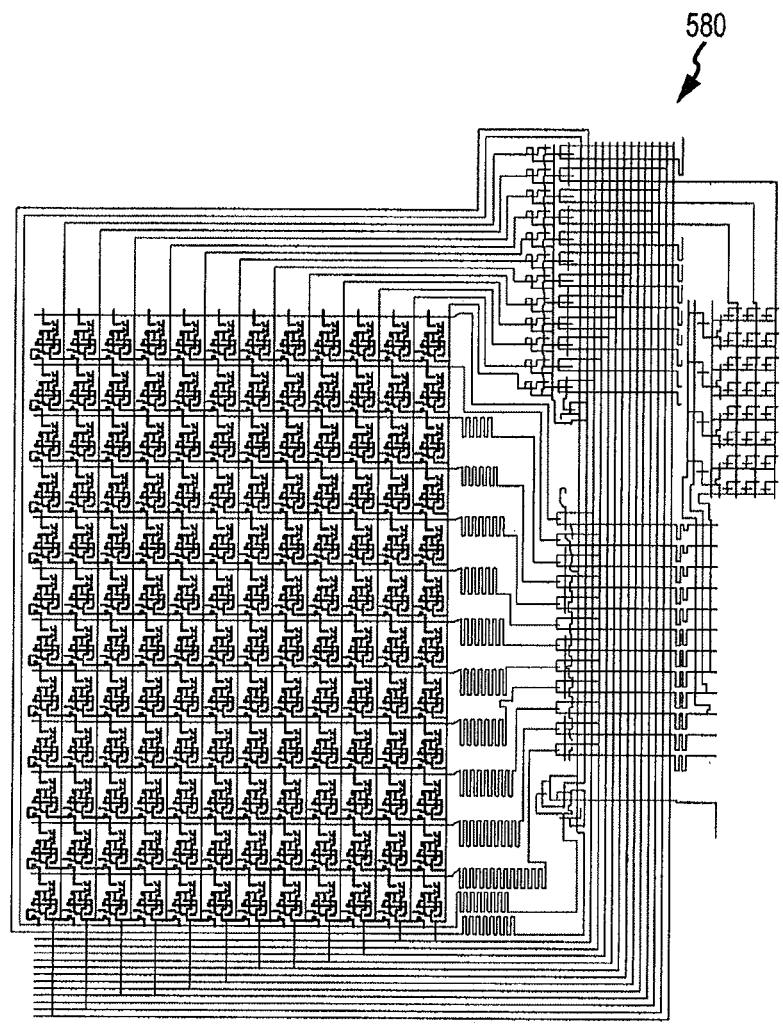
FIG. 17 illustrates a complete QCA implementation of the Goldschmidt divider, in accordance with some examples of the present disclosure.

FIG. 17 illustrates a complete QCA implementation 580 of the Goldschmidt divider, in accordance with some examples of the present disclosure. The area for the Goldschmidt dividers is 89.6 μm² (8818 nm×10158 nm, 55562 cells). The latency for a division is 219 clocks. The delays of the unit blocks are as follows: tag generator=3 clocks, multiplexer & tag decoder=19 clocks, 12-bit multiplier=46 clocks, and wire on data bus=5 clocks.

The Goldschmidt divider is tested using bottom-up verification since a full simulation for a case takes about 7 hours. Each unit block is verified exhaustively, and then the full integration is tested.

Figure 18:
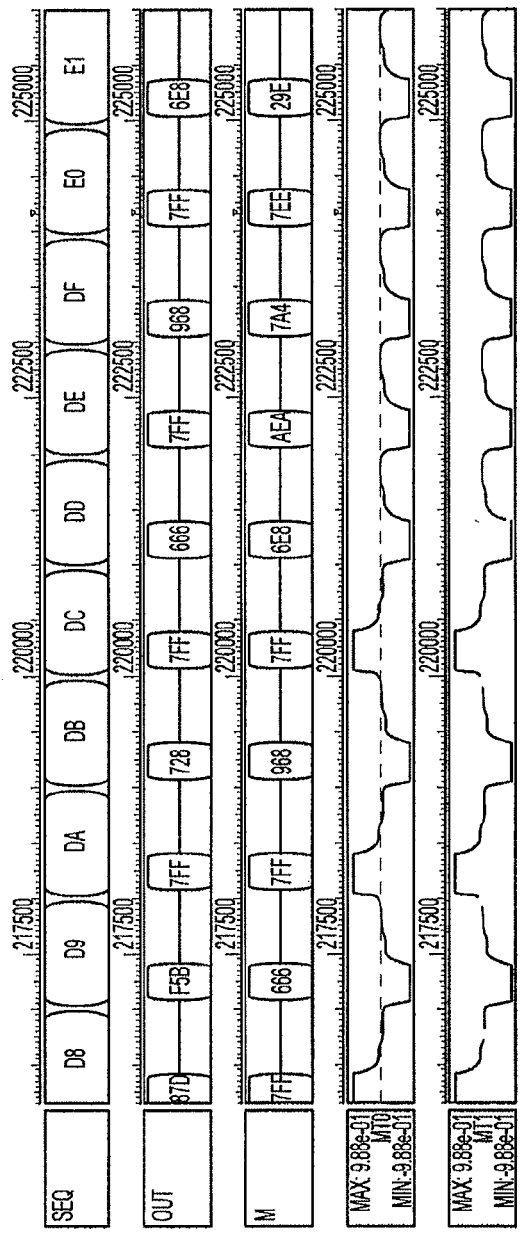
FIG. 18 illustrates a full simulation result using a test vector for four consecutive divisions, in accordance with some examples of the present disclosure.

FIG. 18 illustrates a full simulation result using a test vector for 4 consecutive divisions, in accordance with some examples of the present disclosure. In the waveforms, four correct quotients ($N_2$) start to come out from the 219-th clock, and four $D_2$s, which start from the 218-th clock, are shown correctly as 7FFH.

In QCA, a large computational circuits and systems can be implemented efficiently using the data tag method. Data tags avoid the problems that arise with conventional state machines in QCA and increase the throughput by using the inherent pipelining of QCA.

Figure 19:
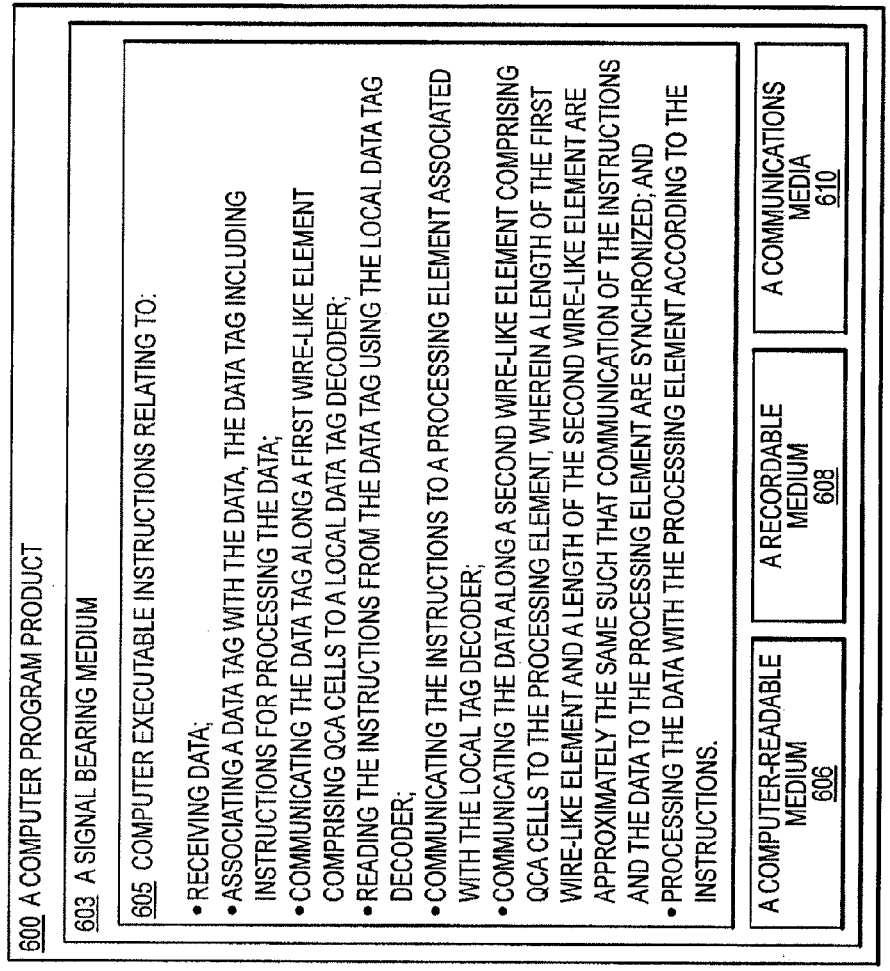
FIG. 19 illustrates a block diagram of an example computer program product in accordance with the present disclosure.

FIG. 19 illustrates a block diagram of an example computer program product 600 in accordance with the present disclosure. In some examples, as shown in FIG. 19, computer program product 600 includes a signal bearing medium 603 that may also include computer executable instructions 605. Computer executable instructions 605 may be arranged to provide instructions for data tag control for QCA. Such instructions may include, for example, instructions relating to receiving data, associating a data tag with the data, the data tag including instructions for processing the data, communicating the data tag along a first wire-like element comprising QCA cells to a local data tag decoder, and reading the instructions from the data tag using the local data tag decoder. The instructions further may include communicating the instructions to a processing element associated with the local tag decoder and communicating the data along a second wire-like element comprising QCA cells to the processing element, wherein a length of the first wire-like element and a length of the second wire-like element are approximately the same such that communication of the instructions and the data to the processing element are synchronized. The instructions then may include processing the data with the processing element according to the instructions. Generally, the computer executable instructions may include instructions for performing any steps of the method for data tag control for quantum dot cellular automata described herein.

Also depicted in FIG. 19, in some examples, computer product 600 may include one or more of a computer readable medium 606, a recordable medium 608 and a communications medium 610. The dotted boxes around these elements may depict different types of mediums media that may be included within, but not limited to, signal bearing medium 603. These types of mediums media may distribute computer executable instructions 605 to be executed by computer devices including processors, logic and/or other facility for executing such instructions. Computer readable medium 606 and recordable medium 608 may include, but are not limited to, a flexible disk, a hard disk drive (HDD), a Compact Disc (CD), a Digital Video Disk (DVD), a digital tape, a computer memory, etc. Communications medium 610 may include, but is not limited to, a digital and/or an analog communication medium (e.g., a fiber optic cable, a waveguide, a wired communication link, a wireless communication link, etc.).

The present disclosure is not to be limited in terms of the particular examples described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods reagents, compounds compositions or biological systems, which can, of course, vary. It is also to be understood that the terminology used herein is for the purpose of describing particular examples only, and is not intended to be limiting. The foregoing describes various examples of systems and methods for data tag control for QCA. These are for illustration only and are not intended to be limiting.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/ or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically matable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range may be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," "greater than," "less than," and the like include the number recited and refer to ranges which may be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to a person having ordinary skill in the art. The various aspects and embodiments disclosed herein are for purposes of illustration and are not intended to be limiting, with the true scope and spirit being indicated by the following claims.

What is claimed is:

1. An apparatus comprising:
    a plurality of quantum-dot cellular automata (QCA) cells to provide a route to communicate data; and
    a stage, wherein at least some of the plurality of QCA cells extend through the stage, the stage including:
    a processing component provided along the at least some of the plurality of QCA cells, the processing component configured to process the data; and
    a local tag decoder communicatively coupled to the processing component to read instructions from a data tag associated with the data and to, based on the instructions, instruct the processing component how to process the data.

2. The apparatus of claim 1, wherein the processing component includes a plurality of majority gates, wherein a majority gate of the plurality of majority gates is arranged from a subset of QCA cells of the plurality of QCA cells.

3. The apparatus of claim 2, wherein the majority gate includes three input QCA cells of the subset of QCA cells to receive input data and an output QCA cell of the subset of QCA cells to provide output data.

4. The apparatus of claim 2, wherein a first majority gate of the plurality of majority gates is configured as an AND gate and a second majority gate of the plurality of majority gates is configured as an OR gate.

5. The apparatus of claim 1, wherein the processing component includes an inverter arranged from a subset of QCA cells of the plurality of QCA cells.

6. The apparatus of claim 1, further comprising a plurality of stages including the stage, wherein the stage of the plurality of stages is configured to perform a computation via one or more processing components.

7. The apparatus of claim 6, wherein the data is associated with a first computation and second data is associated with a second computation, wherein a first stage of the plurality of stages is configured to perform a computation using the data, and wherein a second stage of the plurality of stages is configured to perform a computation using the second data, wherein the computation of the data by the first stage is contemporaneous with the computation of the second data by the second stage.

8. The apparatus of claim 7, wherein the computation of the data is associated with a first Goldschmidt division and the computation of the second data is associated with a second Goldschmidt division.

9. The apparatus of claim 1, further comprising:
a data tag generator to generate the data tag associated with the data; and
an input interface coupled to the data tag generator and configured to receive the data and the data tag, wherein the input interface is further configured to provide the data to a first subset of QCA cells of the plurality of QCA cells, and wherein the input interface is further configured to provide the data tag to a second subset of QCA cells of the plurality of QCA cells.

10. The apparatus of claim 9, wherein receipt of the data at the input interface is contemporaneous with receipt of the data tag at the input interface.

11. An apparatus comprising:
a first route including a first plurality of quantum-dot cellular automata (QCA) cells, the first route having a data tag reader configured to provide instructions based on a data tag; and
a second route including a second plurality of QCA cells, the second route having a processing element communicatively coupled to the data tag reader, the processing element configured to process data based on the instructions,
wherein the first route is configured to provide a route for the data tag and wherein the second route is configured to provide a route for the data.

12. The apparatus of claim 11, wherein the first route further includes one or more additional data tag readers, and wherein the second route further includes one or more additional processing elements, wherein each of the one or more additional data tag readers is communicatively coupled to a respective one of the additional one or more processing elements.

13. The apparatus of claim 12, wherein a first stage includes the processing element, the one or more additional processing elements, the data tag reader, and the one or more additional data tag readers, the first stage further including an input interface coupled to the first and second routes and configured to receive the data and the data tag, and an output interface coupled to at least the first route and configured to provide at least output data.

14. The apparatus of claim 13, wherein output interface of the first stage is further coupled to the second route and is further configured to provide the data tag, the apparatus further comprising a second stage coupled to the first stage and configured to receive the output data and the data tag from the first stage, and configured to provide further output data.

15. The apparatus of claim 14, wherein the second stage includes:
a third route including a third plurality of quantum-dot cellular automata (QCA) cells, the third route having a respective data tag reader configured to provide respective instructions based on the data tag; and
a fourth route including a fourth plurality of QCA cells, the fourth route having a respective processing element communicatively coupled to the respective data tag reader, the respective processing element configured to process the output data based on the respective instructions.

16. The apparatus of claim 11, wherein the processing element includes at least one of an adder, a subtractor, or a multiplier.

17. A method comprising:
communicating a first data tag associated with first data along a first plurality of quantum-dot cellular automata (QCA) cells to a first local data tag decoder, wherein the first data tag includes first instructions;
communicating the first instructions to a first processing element associated with the first local tag decoder;
communicating the first data along a second plurality of QCA cells to the first processing element; and
processing the first data at the first processing element based on the first instructions.

18. The method of claim 17, wherein a length of a route provided by the first plurality of QCA cells is approximately equal to a length of a route provided by the second plurality of QCA cells.

19. The method of claim 18, wherein said processing the first data at the first processing element produces processed data, the method further comprising:
communicating the first data tag along the first plurality of QCA cells to a second local data tag decoder, wherein the second local data tag reader provides second instructions;
communicating the second instructions to a second processing element associated with the second local tag decoder; and
communicating the processed data along the second plurality of QCA cells to the second processing element.

20. The method of claim 19, wherein the first data is associated with a first computation, and wherein the first processing element is included in a first computation stage and the second processing element is included in a second computation stage, the method further comprising, after processing the first data at the first processing element:
communicating a second data tag associated with second data along the first plurality of QCA cells to the first local data tag decoder, wherein the second data tag includes second instructions;
communicating the second instructions to the first processing element;
communicating the second data along the second plurality of QCA cells to the first processing element;
processing the processed data at the second processing element; and
processing the second data at the first processing element contemporaneously with processing of the processed data at the second processing element, wherein processing of the second data is based on the second instructions.

21. The method of claim 20, wherein processing the first data at the first processing element based on the first instructions is part of a first iteration of a Goldschmidt division and processing the processed data at the second processing element is part of a second iteration of the Goldschmidt division.

22. The method of claim 17, further comprising decoding the first data tag to retrieve the first instructions at the first local tag decoder.

23. The method of claim 17, further comprising encoding the first data tag at a data tag generator based on the first data.

24. The method of claim 17, wherein said processing the first data at the first processing element based on the instructions includes performing at least one of a subtraction, multiplication, or addition based on the first data.

25. A method comprising:
routing first data along a first plurality of quantum-dot cellular automata (QCA) cells;
routing second data along a second plurality of QCA cells of the system; and
processing the second data in synchronization with and based on instructions associated with the first data.

26. The method of claim 25, wherein the first data is associated with the second data, the method further comprising generating the first data associated with the second data.

27. The method of claim 25, wherein said processing the second data includes performing a Goldschmidt division iteration using one or more processing elements, wherein the one or more processing elements include at least a portion of the first plurality of QCA cells.

28. The method of claim 27, wherein said performing the Goldschmidt division iteration using one or more processing elements includes:
performing a subtraction operation based on the data at a first of the one or more processing elements; and
performing a multiplication operation at a second of the one or more processing elements responsive to said performing the subtraction operation.

29. The method of claim 25, further comprising sending the processed second data to another plurality of QCA cells.

* * * * *